US012669532B2

(12) United States Patent (10) Patent No.: US 12,669,532 B2
Nam et al. (45) Date of Patent: Jun. 30, 2026

(54) DEFECT DETECTING SYSTEM OF AUTOMOTIVE APPARATUS

(71) Applicant: SAMSUNG ELECTRONICS CO., LTD., Suwon-si (KR)

(72) Inventors: Hyun Seok Nam, Suwon-si (KR); Sang Ho Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 405 days.

(21) Appl. No.: 18/125,395

(22) Filed: Mar. 23, 2023

(65) Prior Publication Data

US 2023/0375606 A1     Nov. 23, 2023

(30) Foreign Application Priority Data

May 17, 2022     (KR) ........................ 10-2022-0060160

(51) Int. Cl.
  *G01R 31/00*      (2006.01)
  *G01R 31/317*     (2006.01)
  *H03K 19/0175*    (2006.01)
(52) U.S. Cl.
  CPC ..... *G01R 31/007* (2013.01); *G01R 31/31703* (2013.01); *G01R 31/31724* (2013.01); *H03K 19/017509* (2013.01)
(58) Field of Classification Search
  CPC ........... G01R 31/007; G01R 31/31703; G01R 31/31724; H03K 19/017509;
(Continued)

(56) References Cited

U.S. PATENT DOCUMENTS 8,612,774 B2    12/2013  Dellow
9,583,216 B2     2/2017  Jones et al.
(Continued)

FOREIGN PATENT DOCUMENTS

JP          H06209307 A   *  7/1994   .............. G06F 11/10
KR    10-2004-0030101 A      4/2004

OTHER PUBLICATIONS

Communication issued on Oct. 26, 2023 by the European Patent Office in European Application No. 23172678.7.
(Continued)

*Primary Examiner* — Andrew Schechter
*Assistant Examiner* — Joshua L Forristall
(74) *Attorney, Agent, or Firm* — Sughrue Mion, PLLC

(57) ABSTRACT

A defect detecting system of an automotive apparatus is provided. The defect detecting system includes: a digital function block including: a memory device configured to store data, and a first Built-In Self Test (BIST) configured to detect a defect of the memory device; an analog function block including a verification parity generator configured to: receive the data through a first path, generate verification parity of the data, and transmit the verification parity to the digital function block through a second path; and a level shift block connected between the digital function block and the analog function block, wherein the level shift block is configured to: convert the first path from a first power supply voltage to a first level based on a second power supply voltage, and convert the second path from the second power supply voltage to a second level based on the first power supply voltage.

20 Claims, 8 Drawing Sheets

(58) Field of Classification Search
CPC .... G11C 2029/0409; G11C 2029/0411; G11C 29/02; G11C 29/12; G11C 29/42; G11C 7/1057; G11C 7/1084
USPC ......................................................... 702/58
See application file for complete search history.

(56) References Cited

U.S. PATENT DOCUMENTS

| | | | | |
|---|---|---|---|---|
| 10,853,167 | B2 | 12/2020 | Lien et al. | |
| 11,037,647 | B1 * | 6/2021 | Cami Gonzalez ..... | G11C 17/14 |
| 11,126,500 | B2 | 9/2021 | Fuller | |
| 2005/0195012 | A1 * | 9/2005 | Sueoka ........... | H03K 3/356182 |
| | | | | 327/333 |
| 2007/0013231 | A1 * | 1/2007 | Yamashita ................ | B60L 1/00 |
| | | | | 307/9.1 |
| 2010/0007366 | A1 * | 1/2010 | Watanabe .............. | G11C 29/56 |
| | | | | 324/750.3 |
| 2018/0231609 | A1 | 8/2018 | Jain et al. | |
| 2020/0116783 | A1 | 4/2020 | Kalva et al. | |
| 2020/0210299 | A1 | 7/2020 | Gulati et al. | |
| 2021/0407613 | A1 * | 12/2021 | Eliash .................... | G11C 29/42 |
| 2023/0214292 | A1 * | 7/2023 | Pandey .............. | G06F 11/0781 |
| | | | | 714/764 |

OTHER PUBLICATIONS

Communication issued on Nov. 8, 2023 by the European Patent Office in European Application No. 23172678.7.
Communication dated Sep. 26, 2025, issued by the Korean Patent Office in Korean Application No. 10-2022-0060160.

* cited by examiner

Figure 7:
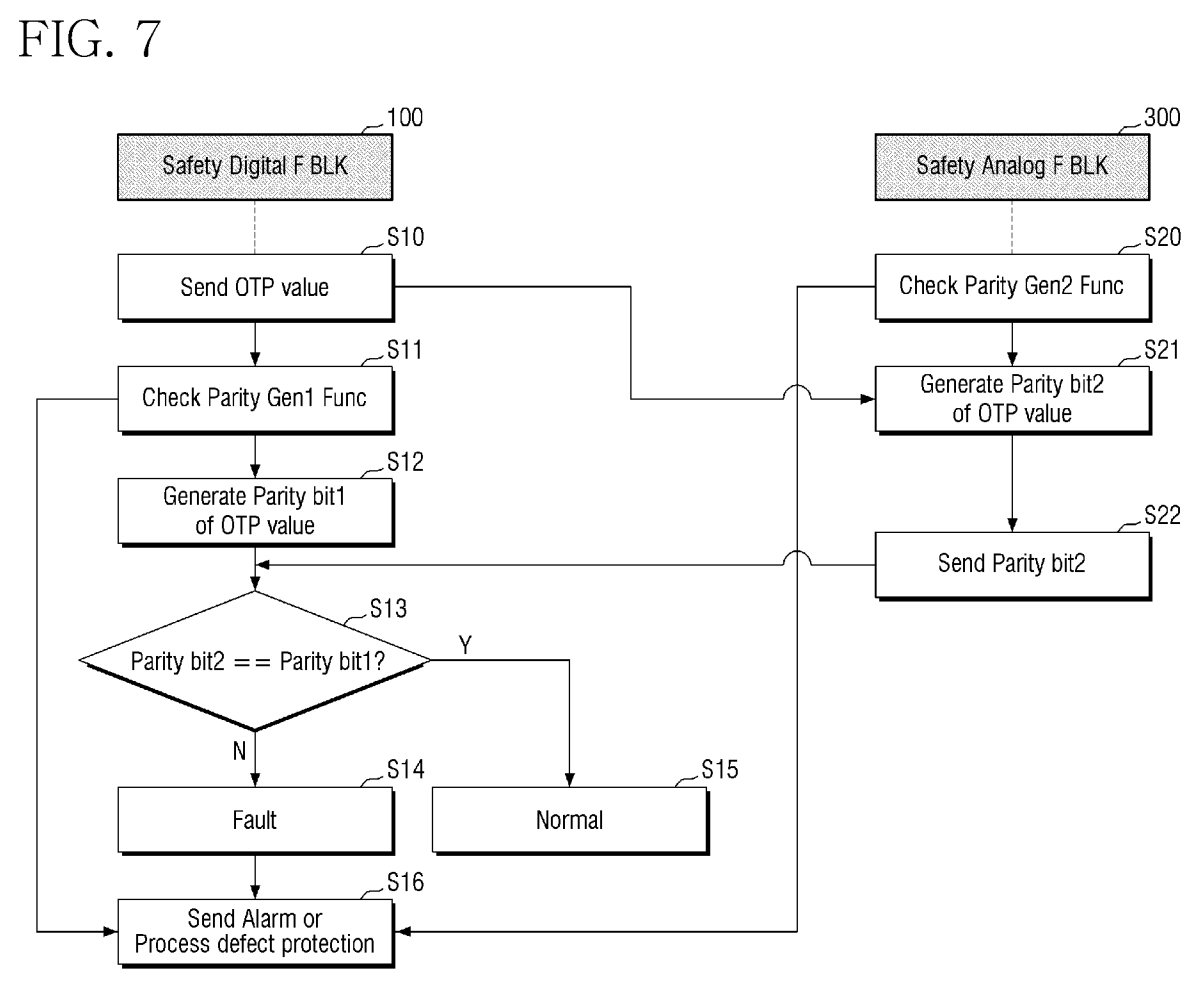

300
Safety Analog F BLK

S20
Check Parity Gen2 Func

S21
Generate Parity bit2 of OTP value

S22
Send Parity bit2

100
Safety Digital F BLK

S10
Send OTP value

S11
Check Parity Gen1 Func

S12
Generate Parity bit1 of OTP value

S13
Parity bit2 = = Parity bit1?

Y

N

S15
Normal

S14
Fault

S16
Send Alarm or Process defect protection

FIG. 8

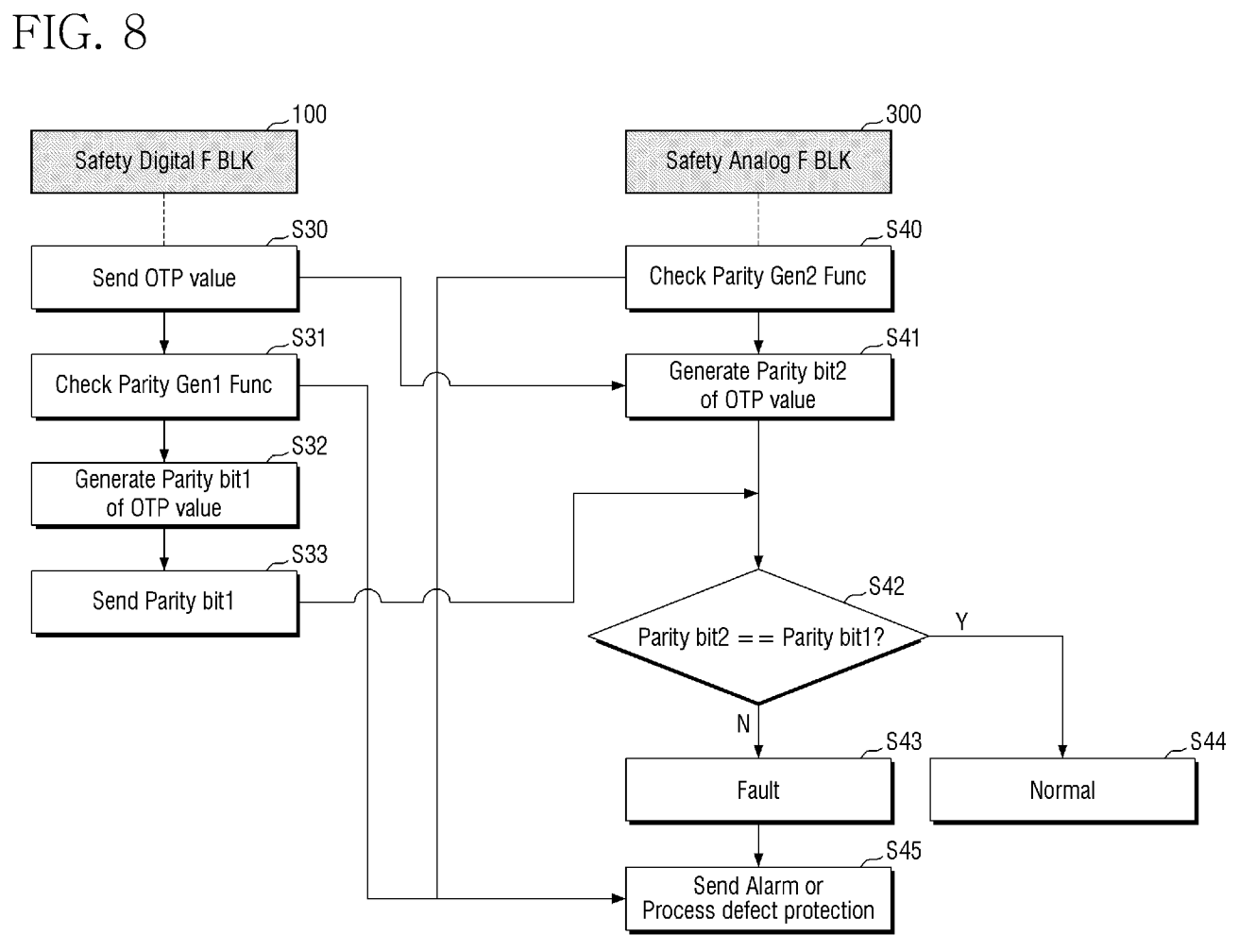

Safety Analog F BLK 300

Check Parity Gen2 Func S40

Generate Parity bit2 of OTP value S41

Parity bit2 = = Parity bit1? S42

Y — Normal S44

N — Fault S43

Send Alarm or Process defect protection S45

Safety Digital F BLK 100

Send OTP value S30

Check Parity Gen1 Func S31

Generate Parity bit1 of OTP value S32

Send Parity bit1 S33

DEFECT DETECTING SYSTEM OF AUTOMOTIVE APPARATUS

This application claims priority from Korean Patent Application No. 10-2022-0060160, filed on May 17, 2022 in the Korean Intellectual Property Office, the disclosure of which is incorporated by reference herein in its entirety.

BACKGROUND

1. Field

The present disclosure relates to a defect detecting device, and more particularly to a defect detecting system of an automotive apparatus.

2. Description of Related Art

A vehicle semiconductor device examines configurations associated with functional safety and needs to enter a safe status when a defect occurs. This is because many aspects of configurations associated with functional safety are directly related to the life and safety of a user who uses the vehicle. International vehicle standard ISO26262 defines various defects and requires safety functions for them.

Defects include a single point fault and a latent fault. The single point fault (SPF) refers to a fault that directly violates the safety goal, and the latent fault (LF) is a fault on the safety function, and whether the fault occurs is neither detected by the safety mechanism nor recognized by the user. Although the latent fault is not a problem when the fault occurs, it can spread to multiple defects and may cause serious consequences accordingly.

In international vehicle standards, according to Automotive Safety Integrity Level (ASIL), the detection ranges for single point fault and latent fault are digitized, and classified from grade A to grade D. A is the lowest grade, D is the highest grade, and the grade D requires a high detection range of the single point fault and the latent fault.

A power management semiconductor (power management integrated circuit (PMIC)) used in an in-vehicle information system (IVI) or the like includes a large number of power wirings and various functions, and thus, functional safety thereof is essentially required. A switching converter, a low-dropout (LDO) regulator or the like for generating multiple voltages needs to be accurately controlled or calibrated for their safety functions. For example, data may be stored in a memory device to perform control and calibration tasks for the PMIC components. Therefore, data integrity may affect not only accuracy of the output voltage of the PMIC, but also safety functions thereof.

SUMMARY

One or more example embodiments provide a defect detecting system for an automotive apparatus that may detect whether the output of the memory device is provided to a function block without defects.

According to an aspect of an example embodiment, a defect detecting system of an automotive apparatus, includes: a digital function block including: a memory device configured to store data, and a first Built-In Self Test (BIST) configured to detect a defect of the memory device; an analog function block including a verification parity generator configured to: receive the data through a first path, generate verification parity of the data, and transmit the verification parity to the digital function block through a second path; and a level shift block connected between the digital function block and the analog function block, wherein the level shift block is configured to: convert the first path from a first power supply voltage to a first level based on a second power supply voltage, and convert the second path from the second power supply voltage to a second level based on the first power supply voltage.

According to an aspect of an example embodiment, a defect detecting system of an automotive apparatus, includes: a digital function block including: a memory device configured to store data, a first Built-In Self Test (BIST) configured to detect a first defect in the memory device, and a comparison parity generator configured to generate a comparison parity for the data; a level shift block including: a first path configured to convert the data based on a first power supply voltage into a level based on a second power supply voltage and transmit the data, and a second path configured to convert the comparison parity based on the first power supply voltage into a level based on the second power supply voltage, and transmit the comparison parity; and an analog function block configured to: generate a verification parity using the level-converted data, receive level-converted comparison parity, compare the comparison parity with the verification parity, and detect whether there is a second defect in either or both of the first path and the second path.

According to an aspect of an example embodiment, a defect detecting system of an automotive apparatus, includes: a digital function block configured to operate at a first supply voltage and including a memory device configured to store data; a first level shift block connected to the digital function block by a first path and configured to convert the data based on a first power supply voltage to a level based on a second power supply voltage; an analog function block connected to the first level shift block by the first path and including a verification parity generator configured to generate verification parity from the level-converted data; and a second level shift block connected between the analog function block and the digital function block by a second path, configured to convert the verification parity based on the second power supply voltage to a level based on the first power supply voltage, wherein the digital function block is configured to detect, based on the verification parity, a first defect in the first path or an error in the data.

However, aspects of the embodiments are not restricted to the one set forth herein. The above and other aspects of embodiments will become more apparent to one of ordinary skill in the art by referencing the detailed description given below.

BRIEF DESCRIPTION OF DRAWINGS

FIG. 2 is a diagram schematically showing a defect detecting system according to some embodiments.

FIG. 4 is a diagram that specifically shows the defect detecting system according to some embodiments.

FIG. 7 is a flowchart showing an embodiment of a defect detecting method for the data transmission/reception path of the defect detecting system shown in FIG. 3.

FIG. 8 is a flow chart showing another embodiment of a defect detecting method for the data transmission/reception path of the defect detecting system shown in FIG. 4.

DETAILED DESCRIPTION

Hereinafter, a defect detecting system of an automotive apparatus according to some embodiments and a defect detecting method thereof will be described referring to FIGS. 1 to 8.

Figure 1:
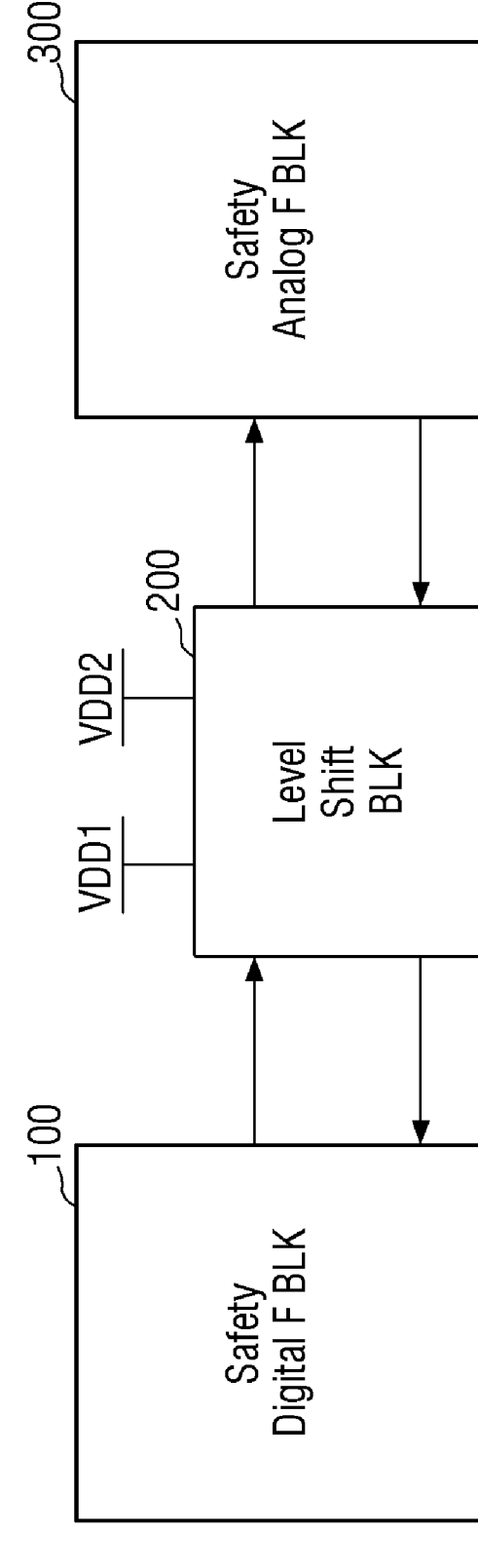
FIG. 1 is a diagram showing a defect detecting system of an automotive apparatus according to some embodiments.

FIG. 1 is a diagram showing a defect detecting system of an automotive apparatus according to some embodiments.

Referring to FIG. 1, the defect detecting system of the automotive apparatus may include a safety-related digital function block 100 (hereinafter referred to as a digital function block which may include, for example, components logic 1 and logic 2), a level shift block 200, and a safety-related analog function block 300 (hereinafter referred to as an analog function block, which may include, for example, components analog 1 and analog 2). According to some embodiments, each of the digital function block 100, the level shift block 200, and the analog function block 300 may be made up of multiple blocks. Each component of the defect detecting system may be a configuration incorporated in a vehicle semiconductor device, or may be a configuration implemented by at least one SoC (System On Chip) according to some embodiments, and may be a configuration that is separately implemented on the physically different substrates but is electrically connected according to some embodiments.

According to some embodiments, the digital function block 100 may operate with a first power supply voltage VDD1, and the analog function block 300 may operate with a second power supply voltage VDD2. When the first power supply voltage VDD1 and the second power supply voltage VDD2 have different voltage levels, the level shift block 200 converts a first signal based on the first power supply voltage VDD1 of the digital function block 100 according to the second power supply voltage VDD2, and outputs the converted signal to the analog function block 300. Also, the level shift block 200 converts a second signal based on the second power supply voltage VDD2 of the analog function block 300 according to the first power supply voltage VDD1, and outputs the converted signal to the digital function block 100.

The level shift block 200 may include a first path that transmits data between the digital function block 100 and the analog function block 200, and a second path that transmits parity for the data between the digital function block 100 and the analog function block 200 according to some embodiments. As an example, the first path may convert the first power supply voltage VDD1 level into the second power supply voltage VDD2 level, and the second path may convert the first power supply voltage VDD1 level into the second power supply voltage VDD2 level. Alternatively, as another example, the first path may convert the first power supply voltage VDD1 level into the second power supply voltage VDD2 level, and the second path may convert the second power supply voltage VDD2 level into the first power supply voltage level VDD1.

Although the level shift block 200 is shown as a single block in the example, it may be implemented as separate level shift block for each path according to various embodiments. Further, according to some embodiments, the level shift block 200 may be implemented as a multiplexer, a buffer, or the like.

The first path may be implemented as N lines corresponding to N-bits, where N is a natural number of 2 or more depending on the size of the data. The second path may be implemented as lines of the number corresponding to at least 1-bit depending on the size of parity. That is, the second path may include lines fewer than the first path.

Figure 2:
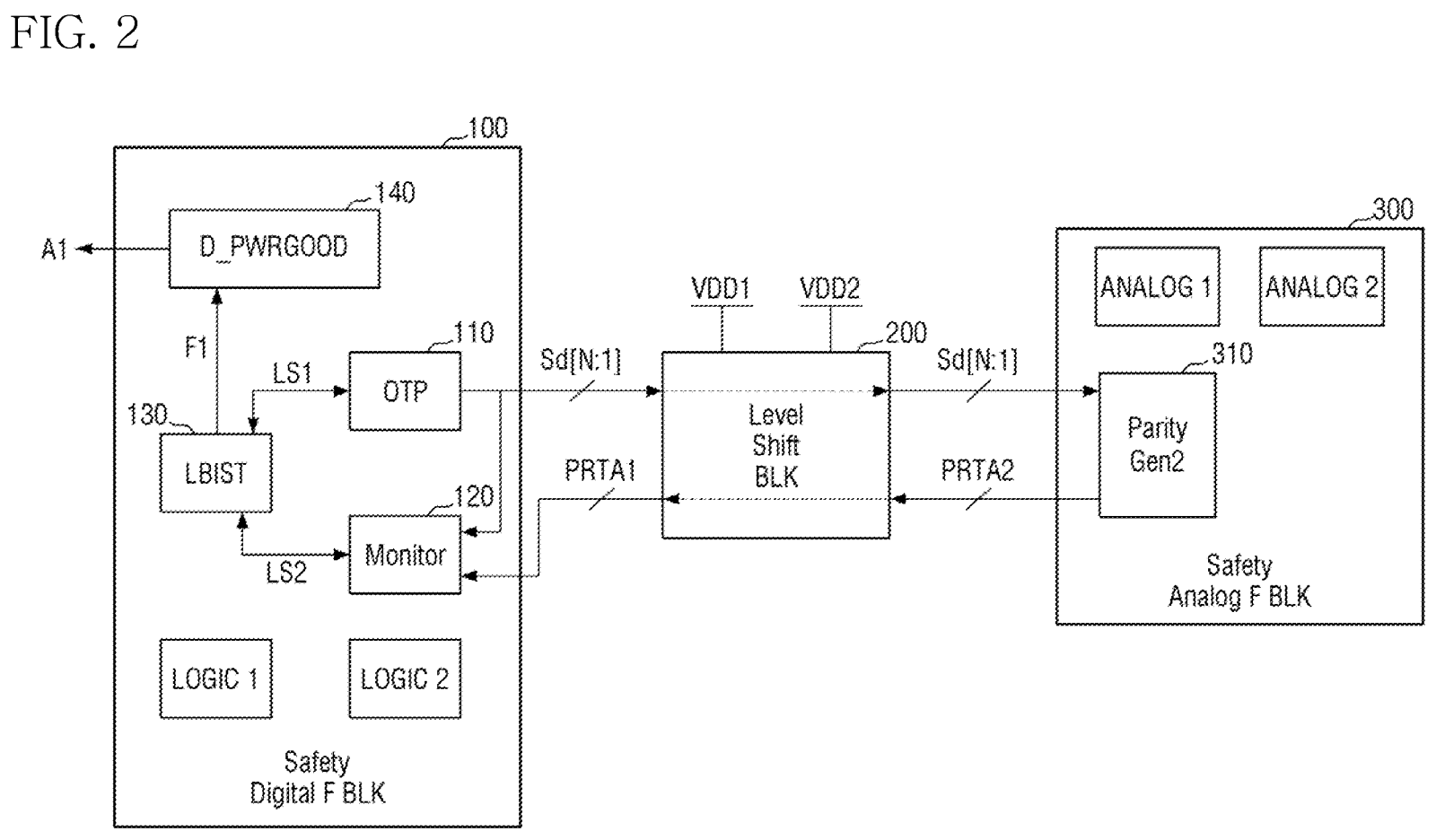

FIG. 2 is a diagram schematically showing a defect detecting system according to some embodiments.

Referring to FIG. 2, according to some embodiments, the digital function block 100 may include a memory device 110, a monitor unit 120, an LBIST (Logical Built-In Self Test) 130, and a digital safety function manager 140. The digital function block 100 may operate by being supplied with the first power supply voltage VDD1. That is, the memory device 110, the monitor unit 120, the LBIST 130, and the digital safety function manager 140 may operate at a voltage level based on the first power supply voltage VDD1. The functional blocks of 100, 200 and 300 such as LBIST 130 and monitor unit 120, etc., may be implemented in hardware or software. For example, the functional blocks may be implemented by a central processing unit (CPU) executing instructions from a program memory. Alternatively or additionally, the functional blocks may be implemented by custom hardware such as an application specific integrated circuit (ASIC).

The memory device 110 stores data relating to the operation of the automotive apparatus. The data may be data that affects the safety functions of the automotive apparatus. According to some embodiments, the data may be control data for components that make up the automotive apparatus. For example, it may be data relating to reference information relating to the operational control of the defect detecting system. According to some embodiments, the memory device 110 may be an one time programmable (OTP) memory device. According to various embodiments, the memory device 110 may be an electronic fuse-based memory or an anti-fuse-based memory. Alternatively, the memory device 110 may be an EEPROM (Electrically Erasable Programmable Read Only Memory) or a flash memory from which the program function is removed.

The level shifter 200 may transmit N-bits data Sd[N:1] from the memory device 110 to the analog function block 300 through the first path.

According to some embodiments, the analog function block 300 may include a parity generator 310. The analog function block 300 may operate by being supplied with the second power supply voltage VDD2. According to some embodiments, the parity generator 310 may operate at a voltage level based on a third power supply voltage VDD3 different from the first and second power supply voltages. For example, the third power supply voltage may be a voltage smaller than the first power supply voltage and the second power supply voltage.

According to some embodiments, the verification parity generator 310 generates a verification parity PRTA2 of the data Sd[N:1] received through the first path. The verification parity may be at least one bit according to some embodiments. It may be set in an even parity type or an odd parity type. For example, when the verification parity is set in the even parity type, the parity bits may be set so a number of bits with value 1 among the values of each bit of the data Sd[N:1] is an even number. For example, when the verification parity is set in the odd parity type, the parity bits may be set so that a number of bits with value 1 among the bit values of the data Sd[N:1] is an odd number.

Alternatively, according to some embodiments, the verification parity generator 310 may generate verification parity in a checksum type. In this case, the data may further include checksum data.

The level shifter 200 may level-convert the verification parity PRTA2 through the second path to generate the verification parity PRTA1 and transmit PRTA1 to the digital function block 100.

The LBIST (Logical Built-In Self Test) 130 tests each component of the digital function block 100 to detect whether each component is defective. The LBIST 130 is a built-in self-test circuit (BIST), and may be a device designed to drive a test program transmitted from outside (e.g., a host system). The test program may be made up of commands for performing the test operation on the digital function block 100.

For example, the LBIST 130 tests the memory device 110 to detect presence of defects in the memory device 110 itself (LS1). For example, the LBIST 130 tests the monitor unit 120 to detect the presence of defects in the monitor unit 120 itself (LS2).

The monitor unit 120 receives the verification parity PRTA1 through the second path. The monitor unit 120 checks the verification parity PRTA1 on the basis of the data Sd[N:1] that is output from the memory device 110 to the first path. For example, if the verification parity PRTA1 matches the appropriate parity bit according to the preset method, the monitor unit 120 determines it as a normal operation (for example, True), and notifies the LBIST 130 of the test result (LS2) of the verification parity PRTA1. For example, if the verification parity PRTA1 does not match the appropriate parity bits according to the preset method, the monitor unit 120 determines it as an error operation (e.g., false), and notifies the LBIST 130 of the test result (LS2) of the verification parity PRTA1. In this case, the LBIST 130 may determine that the error operation is an error for the first path. The reception of the PRTA1 based on the parity calculation in the safety analog function block 300 provides a test of VDD2. If the monitor 120 determines that the test fails, the LBIST 130 may send a test signal to OTP 110 to see if OTP 110 is operating properly. If OTP 110 is operating properly, then a fault exists in either the level shift block 200 (powered in part by VDD2) or in the safety analog function block 300. As discussed below regarding ABIST 340 of FIG. 3, a fault in the parity generator block 310 can be detected by ABIST 340. Thus the LBIST 130 can isolate a fault detected at the monitor 120 as arising from a particular one of the OTP 110, the level shift block 200 and the safety analog block 300.

The LBIST 130 generates the defect information F1 by comprehensively considering the status information LS1 of the memory device 110, and the status information LS2 of the monitor unit 120 itself or the monitor unit 120 based on the error of the first path. That is, it is possible to output any one defect information F1 corresponding to the current status information LS1 and the current status information LS2 among the plurality of pieces of defect information corresponding to the plurality of statuses.

The digital safety function manager 140 receives the defect information F1 from the LBIST 130, evaluates component status of the components included in the digital function block 100, controls related functions, and generates an alarm. For example, the digital safety function manager 140 may send an alarm corresponding to the defect information F1 to a host system included in the automotive apparatus.

For example, the digital safety function manager 140 compares the transmitted data Sd[N:1] with the verification parity, and if it is determined that the data transmission in the first path is normal, that is, checking result of the verification parity is a normal mode, the digital safety function manager 140 determines that the data is transmitted normally, and may perform a control so that the next operation is performed without generating an alarm (A1). For example, the digital safety function manager 140 compares the transmitted data Sd[N:1] with the verification parity, if it is determined that the data transmission in the first path is erroneous, that is, the checking result of the verification parity is an error mode, the digital safety function manager 140 determines that the automotive apparatus may not normally perform the next operation, and generates an alarm (A1). In the case of the error mode, the digital safety function manager 140 controls to stop execution of the next operation or replace it with another operation.

Figure 3:
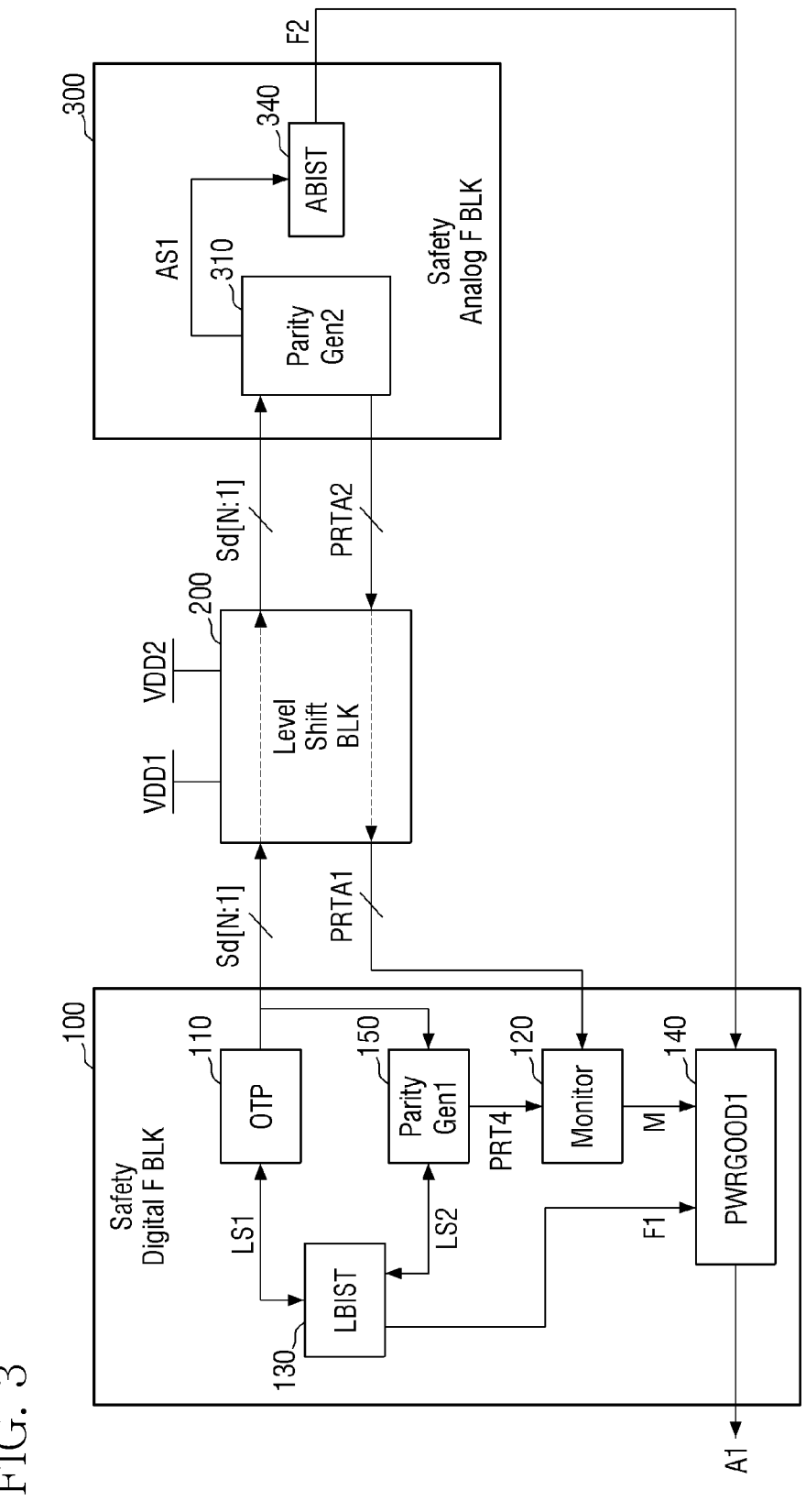
FIG. 3 is a diagram that specifically shows the defect detecting system according to some embodiments.

FIG. 3 is a diagram that specifically shows the defect detecting system according to some embodiments. For convenience of explanation, repeated explanation of contents of FIG. 2 will not be provided.

Referring to FIG. 3, according to some embodiments, the digital function block 100 may include a memory device 110, a monitor unit 120, an LBIST (Logical Built-In Self Test) 130, a digital safety function manager 140, and a comparison parity generator 150. The digital function block 100 may operate by being supplied with the first power supply voltage VDD1. That is, the memory device 110, the monitor unit 120, the LBIST 130, and the digital safety function manager 140 may operate at a voltage level based on the first power supply voltage VDD1.

The comparison parity generator 150 may operate by being supplied with the first power supply voltage VDD1 according to some embodiments, or may operate by being supplied with the fourth power supply voltage VDD4 according to some embodiments. The fourth power supply voltage VDD4 may be a voltage smaller than the first power supply voltage VDD1 and the second power supply voltage VDD2. The comparison parity generator 150 is connected to the output terminal of the memory device 110 to receive data, and generates a comparison parity PRT4 on the basis of the received data.

The monitor unit 120 receives the verification parity PRTA1 through the second path. The monitor unit 120 compares the comparison parity PRT4 received from the parity generator 150 with the verification parity PRTA. For example, if the verification parity PRTA1 matches the comparison parity PRT4, the monitor unit 120 determines a normal operation (for example, True), and notifies the digital safety function manager 140 of the test result M of the verification parity PRTA1. For example, if the verification parity PRTA1 does not match the comparison parity PRT4, the monitor unit 120 determines an error operation (e.g., False), and notifies the digital safety function manager 140 of the test result M of the verification parity PRTA1.

The LBIST 130 checks and detects defects in each component inside the digital function block 100. For example, the LBIST 130 may monitor the status information LS1 of the memory device 110, and may check whether there is a defect in the memory device 110 itself. The LBIST 130 may monitor the status information LS2 of the parity generator 150, and may check whether there is a defect in the parity generator 150 itself. The defect of each component itself may mean, for example, a case where the component does not operate at all, or an abnormal value is returned without performing an expected operation to send an expected value, when the LBIST 130 sends a test signal.

That is, the LBIST 130 outputs the defect information F1 to the digital safety function manager 140 according to the status information LS1 of the memory device 110 and the status information LS2 of the parity generator 150 itself. The defect information F1 may output that there is no defect in each component (for example, 110 and 150), or may include, for example, a preset code corresponding to a defect symptom if it is determined that a defect occurs in at least one component.

According to some embodiments, the analog function block 300 may include a parity generator 310 and an ABIST (Analog Built-In Self Test) 340. The analog function block 300 may operate by being supplied with the second power supply voltage VDD2. According to some embodiments, the parity generator 310 may operate at a voltage level based on a third power supply voltage VDD3 different from the first and second power supply voltages. For example, the third power supply voltage may be a voltage smaller than the first power supply voltage and the second power supply voltage.

The digital safety function manager 140 may further receive the defect information F2 at the analog function block 300. The defect information F2 may be generated by the ABIST 340 included in the analog function block 300.

The ABIST 340 checks and detects defects of each component included in the analog function block 300. The ABIST 340 is an analog built-in self test circuit (BIST), and may be a device designed to drive a test program that is transmitted from outside (e.g., a host system). The test program may be made up of commands for performing test operations on the analog function block 300.

For example, the ABIST 340 generates defect information F2 on the basis of the status information AS1 of the verification parity generator 310 itself. For example, when the verification parity generator 310 itself does not operate or it is determined that there is a defect during operation, the ABIST 340 transmits the defect information F2 to the digital safety function manager 140. The defect information F2 may include, for example, a value corresponding to no defect in each component (e.g., 310), or a preset value corresponding to a defect symptom if at least one component is determined to be defective.

The digital safety function manager 140 receives the defect information F1 from the LBIST 130 and the defect information F2 from the ABIST 340, evaluates component status of the components included in the digital function block 100 and the analog function block 300, controls related functions, and generates an alarm. For example, the digital safety function manager 140 may send an alarm A1 corresponding to the defect information F1 and F2 to a host system included in the automotive apparatus.

Figure 4:
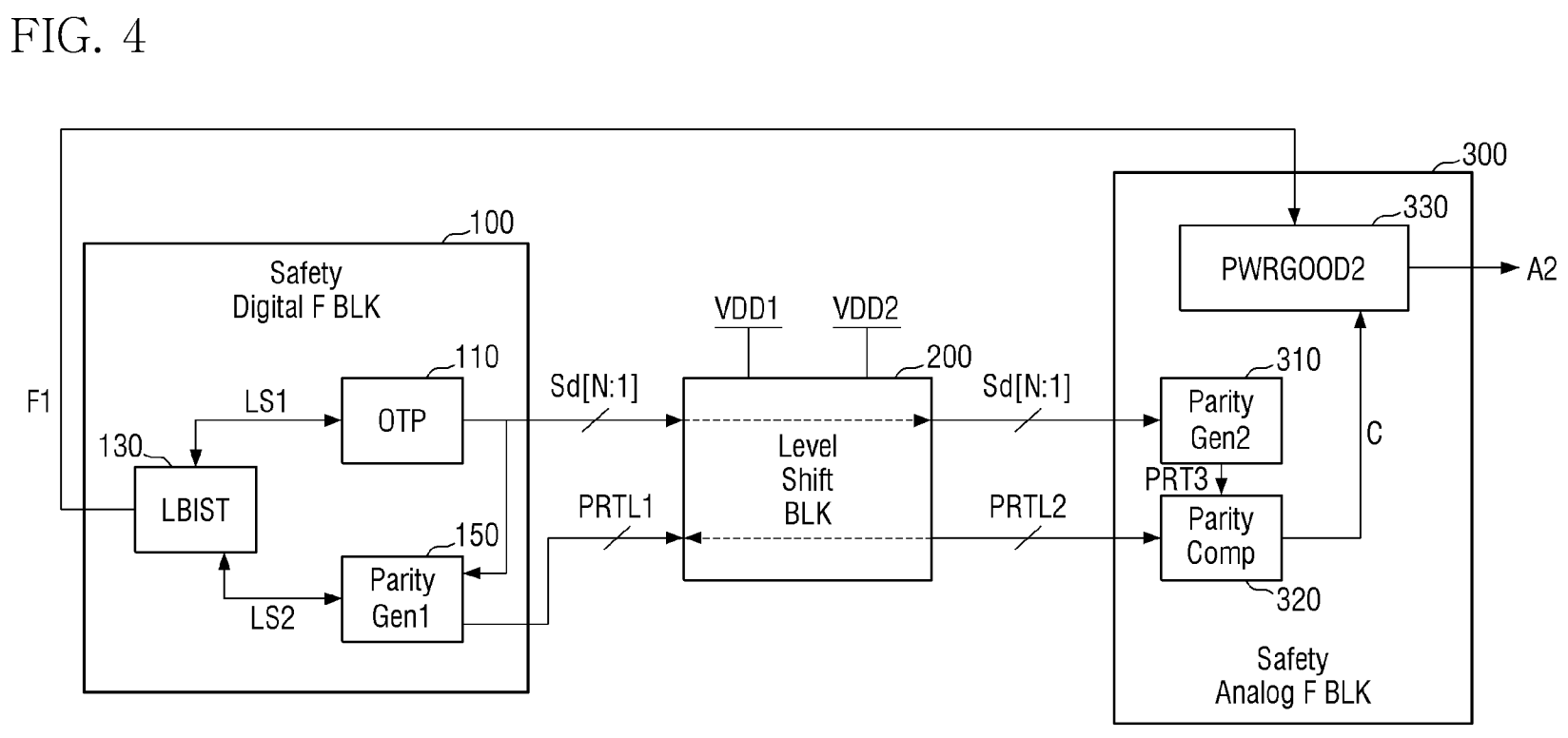

FIG. 4 is a diagram that specifically shows the defect detecting system according to some embodiments.

Referring to FIG. 4, the digital function block 100 according to some embodiments may include a memory device 110, a LBIST (Logical Built-In Self Test) 130, and a comparison parity generator 150. The digital function block 100 may operate by being supplied with the first power supply voltage VDD1. According to an embodiment, the memory device 110, the LBIST 130, and the comparison parity generator 150 may operate at voltage levels based on the first power supply voltage VDD1. According to an embodiment, the comparison parity generator 150 may operate by being supplied with a third power voltage VDD3 level lower than the first power voltage VDD1.

The memory device 110 stores data relating to the operation of the automotive apparatus. According to some embodiments, the memory device 110 may be a one time programmable (OTP) memory device.

The level shift block 200 may transmit N-bits data Sd[N:1] from the memory device 110 to the analog function block 300 through the first path. In the first path, data corresponding to the first power supply voltage VDD1 is converted into data based on the second power supply voltage VDD2 and output.

The level shift block 200 may transmit the comparison parity PRTL1 of at least one bit or more from the comparison parity generator 150 to the analog function block 300 through the second path. In the second path, the comparison parity according to the first power supply voltage VDD1 is converted into the comparison parity based on the second power supply voltage VDD2 and output.

According to some embodiments, the analog function block 300 may include a parity generator 310, a parity comparator 320, and an analog safety function manager 330. The analog function block 300 may operate by being supplied with the second power supply voltage VDD2. According to some embodiments, the parity generator 310 and the parity comparator 320 may operate at a voltage level based on a third power supply voltage VDD3 different from the first and second power supply voltages. For example, the third power supply voltage may be a voltage smaller than the first power supply voltage and the second power supply voltage.

The verification parity generator 310 generates a verification parity PRT3 of the level-converted data Sd[N:1] received in the first path. The parity generating type of the verification parity generator 310 uses the same type as the parity generating type of the comparison parity generator 150. For example, if the comparison parity generator 150 uses an even parity generating type, the verification parity generator 310 may also use an even parity generating type.

The parity comparator 320 compares the generated verification parity PRT3 with the comparison parity PRTL2 received in the second path, and transmits the comparison result C to the analog safety function manager 330. If the comparison result verification parity PRT3 is the same as the comparison parity PRTL2, the parity comparator 320 determines that the data Sd[N:1] is received normally. If the comparison result verification parity PRT3 and the comparison parity PRTL2 are not the same, the parity comparator 320 determines that the data Sd[N:1] is not successfully received, and transmits the comparison result C to the analog safety function manager 330.

When the analog safety function manager 330 receives the comparison result C and checks that the data is not received normally, it sends an alarm A2 to the host system of the automotive apparatus. According to some embodiments, if the comparison result C is the normal mode, the analog safety function manager 330 determines that the data is successfully transmitted, and may control to perform the next operation without generating the alarm A2. For example, when the comparison result C is the error mode, the analog safety function manager 330 determines that the automotive apparatus cannot normally perform the next operation, and generates the alarm A2. In the case of the error mode, the analog safety function manager 330 controls to stop execution of the next operation or replace it with another operation.

Figure 5:
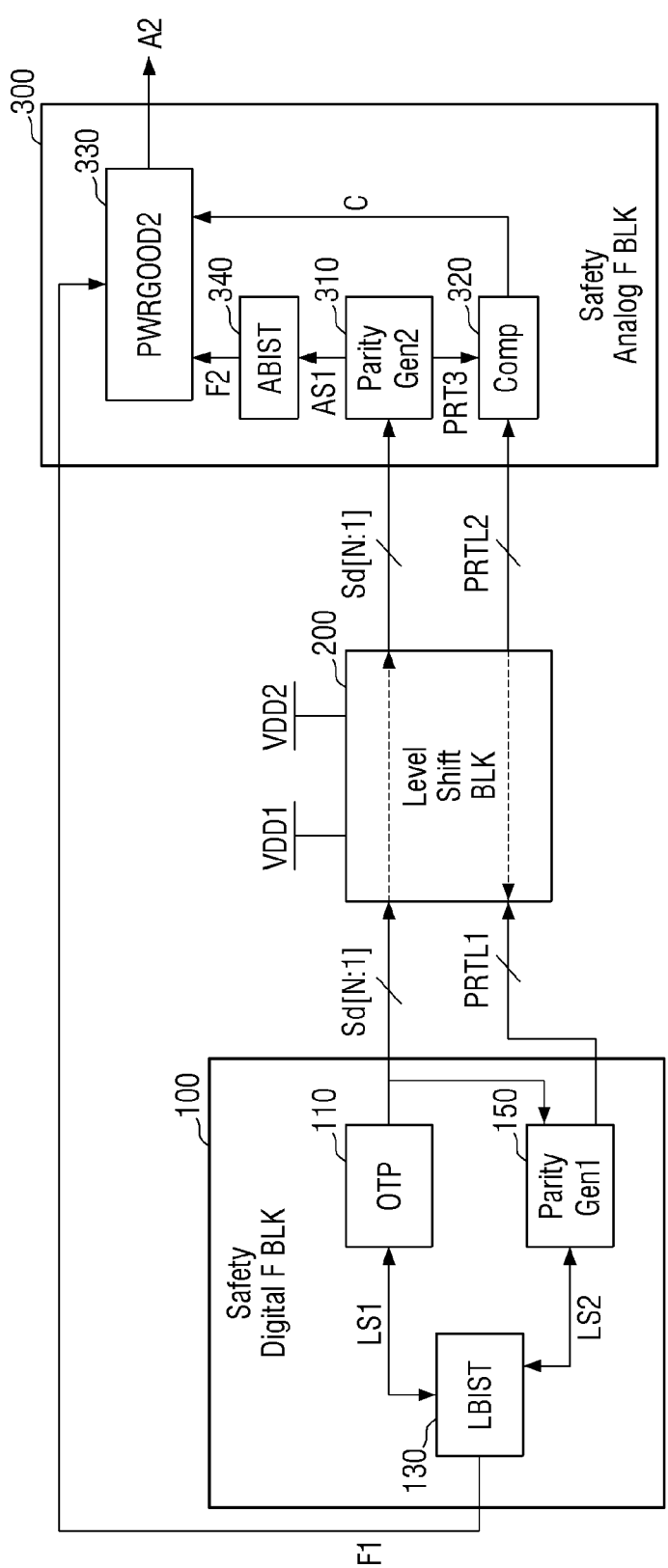
FIG. 5 is a diagram that schematically shows a defect detecting system according to some embodiments.

FIG. 5 is a diagram that schematically shows a defect detecting system according to some embodiments. For convenience of explanation, repeated explanation of contents of FIG. 4 will not be provided.

Referring to FIG. 5, according to some embodiments, the digital function block 100 may include a memory device 110, a LBIST (Logical Built-In Self Test) 130, and a comparison parity generator 150. The digital function block 100 may operate by being supplied with the first power supply voltage VDD1. According to an embodiment, the memory device 110, the LBIST 130, and the comparison parity generator 150 may operate at voltage levels based on the first power supply voltage VDD1. According to an embodiment, the comparison parity generator 150 may operate by being supplied with a third power voltage VDD3 level lower than the first power voltage VDD1.

The LBIST 130 may receive the status information LS1 of the memory device 110 itself and the status information LS2 of the comparison parity generator 150 itself to check whether there is a defect. The LBIST 130 may generate the defect information F1 based on the status information LS1 and the status information LS2. The defect information F1 may be transmitted to the analog safety function manager 330.

The level shift block 200 converts the operating voltage level so that the operating voltage based on the first power supply voltage VDD1 is based on the second power supply voltage VDD2. The level shift block 200 may transmit N-bit data Sd[N:1] from the memory device 110 to the analog function block 300 through the first path. The level shift block 200 may transmit the comparison parity PRTL1 of at least one bit or more from the comparison parity generator 150 to the analog function block 300 through the second path.

According to some embodiments, the analog function block 300 may include a parity generator 310, a parity comparator 320, an ABIST 340, and an analog safety function manager 330. The analog function block 300 may operate by being supplied with the second power supply voltage VDD2. According to some embodiments, the parity generator 310 and the parity comparator 320 may operate at a voltage level based on the third power supply voltage VDD3 different from the first and second power supply voltages. For example, the third power supply voltage may be a voltage smaller than the first power supply voltage and the second power supply voltage.

The verification parity generator 310 generates a verification parity PRT3 of the level-converted data Sd[N:1] received in the first path. The parity generating type of the verification parity generator 310 uses the same type as the parity generating type of the comparison parity generator 150.

The ABIST 340 checks and detects defects of each component included in the analog function block 300. For example, the ABIST 340 generates defect information F2 based on the status information AS1 of the verification parity generator 310 itself. For example, when the verification parity generator 310 itself does not operate or it is determined that there is a defect during operation, the ABIST 340 transmits the defect information F2 to the digital safety function manager 140.

The parity comparator 320 compares the generated verification parity PRT3 with the comparison parity PRTL2 received in the second path, and transmits the comparison result C to the analog safety function manager 330.

When the analog safety function manager 330 receives the comparison result C to check that the data is not received normally, or receives the defect information F2 and the defect information F1 of the LBIST 130 from the ABIST 340, the analog safety function manager 330 sends the alarm A2 to the host system of the automotive apparatus. According to some embodiments, if the comparison result C is the normal mode or if the defect information (F1, F2) is not received (or if the comparison result C is determined to be normal on the basis of the defect information (F1, F2), the analog safety function manager 330 determines that the data is transmitted normally, and may control to perform the next operation without generating the alarm A2. For example, if the comparison result C is an error mode or if the defect information (F1, F2) is received (or if the comparison result C is determined to be not normal on the defect information (F2)), the analog safety function manager 330 determines that the automotive apparatus may not normally perform the next operation, and generates the alarm A2.

If the comparison result C is determined to be an error mode due to data transmission/reception path from the defect information (F1, F2) or a defect in each component, the analog safety function manager 330 stops executing the next operation or controls to replace it with another operation.

Figure 6:
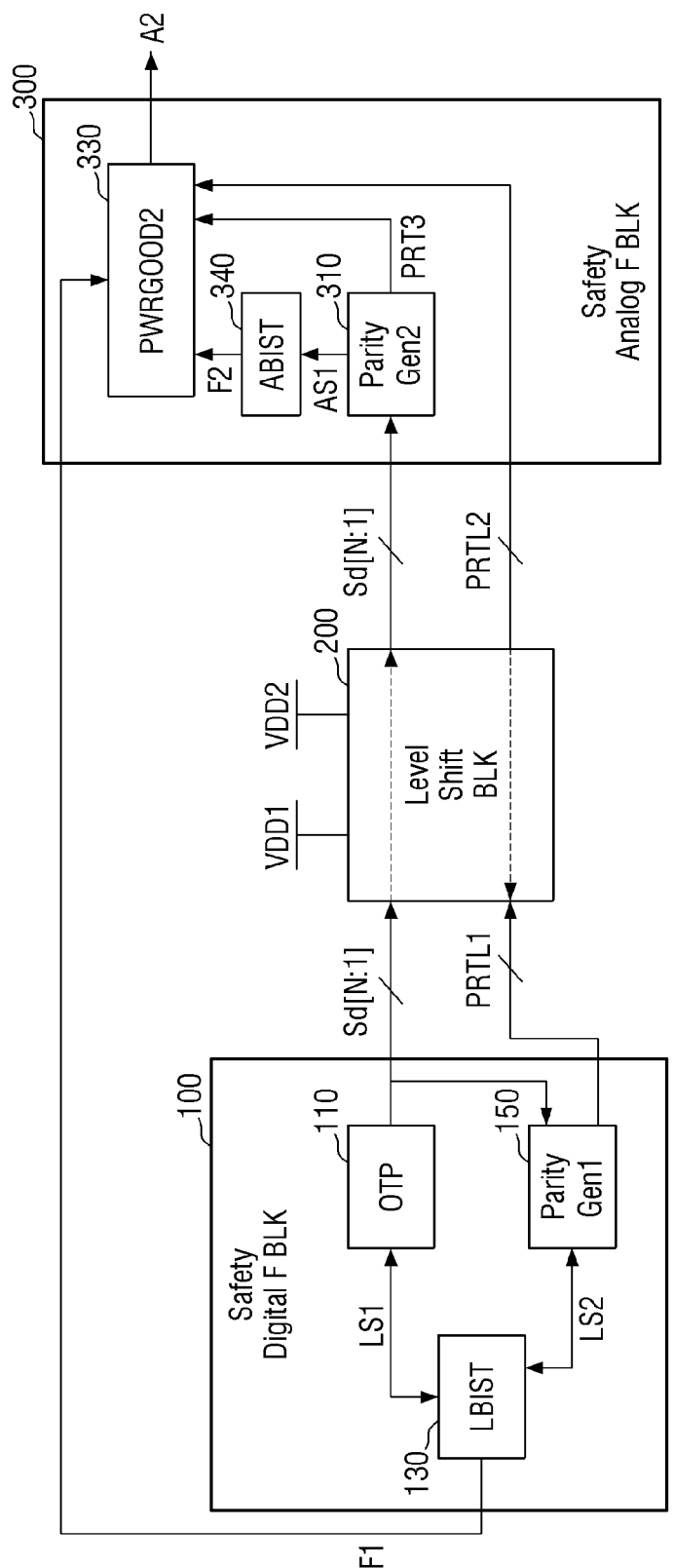
FIG. 6 is a diagram that schematically shows a defect detecting system according to some embodiments. For convenience of description, the description will be made in comparison with FIGS. 4 and 5.

FIG. 6 is a diagram that schematically shows a defect detecting system according to some embodiments. For convenience of description, the description will be made in comparison with FIGS. 4 and 5.

Referring to FIG. 6, the analog safety function manager 330 may directly receive the verification parity PRT3 generated by the parity generator 310 and the comparison parity PRTL2 received in the second path. The analog safety function manager 330 may compare the verification parity PRT3 with the comparison parity PRTL2.

For example, if the analog safety function manager 330 determines that the comparison result between the verification parity PRT3 and the comparison parity PRTL2 is normal, or that the status of each component is normal on the basis of the defect information F1 and F2, the analog safety function manager 330 determines that the data is transmitted normally, and may control to perform the next operation without generating the alarm A2.

For example, when the analog safety function manager 330 determines that the comparison result between the verification parity PRT3 and the comparison parity PRTL2 is not normal, or receives a predefined value corresponding to a defect symptom based on the defect information F1 and F2, the analog safety function manager 330 determines that the next operation cannot be executed normally, and generates the alarm A2.

FIGS. 7 and 8 show a defect detecting method for checking whether there is a functional defect in the data transmission/reception path between the digital function block 100 and the analog function block 300. FIG. 7 is a flowchart showing an embodiment of a defect detecting method for the data transmission/reception path of the defect detecting system shown in FIG. 3. FIG. 8 is a flow chart showing another embodiment of a defect detecting method for the data transmission/reception path of the defect detecting system shown in FIG. 4.

Referring to FIGS. 7 and 8, the defect detecting system of the automotive apparatus according to some embodiments includes a digital function block 100 and an analog function block 300.

The defect detecting system inspects whether there is a defect in the components included in each of the digital function block 100 and the analog function block 300 after the power is turned on first.

According to some embodiments, the LBIST 130 inspects whether there is a defect in the internal components included in the digital function block 100. For example, the LBIST 130 checks whether there are defects in the memory device 110 and the parity generator 150 described in FIGS. 2 to 6 through the defect information LS1 and LS2.

According to some embodiments, the ABIST 340 inspects whether there is a defect in the internal components included in the analog function block 300. For example, the ABIST 340 may check whether there is a defect in the parity generator 310 described in FIGS. 2 to 6 through the defect information AS1 and LS2.

In an embodiment, the defect detecting system may perform a defect detecting operation on each internal component before step S10 for the digital function block 100 and before step S20 for the analog function block 300.

In another embodiment, the defect detecting system may perform the defect detecting operation on each internal component at any time. For example, the defect detecting operation may be performed immediately before using the corresponding component in the digital function block 100 and the analog function block 300. Although FIG. 7 explains an example in which the defect detection operation is frequently performed on the components, embodiments are not limited thereto.

For example, the analog function block 300 inspect whether there is a defect in the parity generator 310 through the ABIST (Analog Built-In Self Test), and may check whether there is a defect in the parity generator 310 through the received defect information AS1. If it is determined that there is a defect in the parity generator 310 itself, the analog function block 300 transfers the analog defect information F2 to the digital safety function manager 140 without performing subsequent steps S21 and S22, and the digital safety function manager 140 may send an alarm to the outside or perform a protective operation against defects (S16).

However, if there is no defect in the parity generator 310 itself (S20), the defect information system may check whether there is a defect in the data transmission/reception path. The digital function block 100 outputs N-bit data (e.g., Sd[N:1] of FIGS. 3 to 6) stored in the memory 110 to the analog function block 300 through the level shift block 200 (S10). For example, the digital function block 100 may inspect whether there is a defect in the parity generator 150 through the LBIST 130, and may check whether there is a defect in the parity generator 150 through the received defect information LS1. If it is determined that there is a defect in the parity generator 150 itself, the digital function block 100 transfers the digital defect information F1 to the digital safety function manager 140 without performing subsequent steps S12 to S15, and the digital safety function manager 140 may send an alarm to the outside or perform a protective operation against defect (S16).

However, if there is no defect in the parity generator 150 itself (S11), the digital function block 100 may continue to inspect whether there is a defect in the data transmission/reception path. The parity generator 150 generates comparison parity for the output data (S12), and the parity generator 310 receives the level-converted N-bit data and generates verification parity for the data (S21). At this time, the comparison parity and the verification parity may be generated, using the same parity generating type.

When the analog function block 300 replies the verification parity to the digital function block 100 (S22), the digital function block 100 compares the comparison parity (Parity bit 1) with the verification parity (Parity bit 2) (S13), and checks whether the data is transmitted successfully.

If the comparison parity (Parity bit 1) and verification parity (Parity bit 2) have the same value (S13, Y), the digital function block 100 determines that the data transmission is normal (S15). However, if the comparison parity (Parity bit 1) and verification parity (Parity bit 2) have different values (S13, N), the digital function block 100 determines that there is a defect in the data transmission (Fault) (S14), sends alarm to the host system or performs a protective operation against the detect, such as stopping of functions (S16).

That is, according to some embodiments, the defect detecting system may find defects of each component itself of the digital function block or the analog function block in step S11 or S20, or may find defects of the line (for example, the first path or the second path described in FIGS. 1 to 6) through which data is transmitted, even if it is checked that there is no defect in each component itself of the digital or analog function block.

Referring to FIG. 4 or 5 and 8, in an embodiment, the defect detecting system may perform the defect detecting operation for each internal component before step S30 in the digital function block 100 and before step S40 in the analog function block 300.

In another embodiment, the defect detecting system may perform the defect detecting operations on each internal component at any time. For example, the defect detecting operations may be performed immediately before using the corresponding component in the digital function block 100 and the analog function block 300. Although FIG. 8 explains an example in which the defect detection operation is frequently performed on corresponding components, embodiments are not limited thereto.

For example, the analog function block 300 may check whether there is a defect before using the parity generator 310. The presence or absence of a defect in the parity generator 310 is inspected, and the presence or absence of a defect in the parity generator 310 may be checked through the received defect information AS1 (S40). If it is determines that there is a defect in the parity generator 310 itself, the analog function block 300 transfers the analog defect information F2 to the analog safety function manager 330 without performing subsequent steps S41 to S44, and the analog safety function manager 330 may send an alarm to the outside or perform a protective operation against defects (S45).

However, if there is no defect in the parity generator 310 itself (S40), the defect information system may inspect whether there is any defect in the data transmission/reception path. The digital function block 100 outputs N-bit data (e.g., Sd[N:1] of FIGS. 3 to 6) stored in the memory 110 to the analog function block 300 through the level shift block 200 (S30). For example, the digital function block 100 may check whether there is a defect in the parity generator 150 through the defect information LS1 received from the defect presence or absence of the parity generator 150 (S31). If the parity generator 150 itself is determined to be defective, the digital function block 100 transmits the digital defect information F1 to the analog safety function manager 330 without performing subsequent steps S32 and S33, and the analog function manager 330 may send an alarm to the outside or perform a protective operation against defects (S45).

However, if there is no defect in the parity generator 150 itself (S31), the digital function block 100 may continue to inspect whether there is a defect in the data transmission/reception path. The parity generator 150 generates comparison data (Parity bit 1) based on the output data (S32), and outputs the comparison data to the analog function block 300.

Upon receiving data from the digital function block 100, the parity generator 310 generates verification data of the data (Parity bit 2) (S41). In this case, the verification data may be generated in the same parity generating type as the comparison data.

The parity generator 310 compares the comparison parity (Parity bit 1) with the verification parity (Parity bit 2) (S42) to check that the data is transmitted normally.

If the comparison parity (Parity bit 1) and the verification parity (Parity bit 2) have the same value, the analog function block 300 determines that the data transmission is normal (S44). However, if the comparison parity (Parity bit 1) and the verification parity (Parity bit 2) have different values, the analog function block 300 determines that there is a defect in the data transmission (Fault) (S43), sends an alarm to the host system or performs a protective operation against defects such as stopping of the function (S45). In this case, according to some embodiments, the analog function block 300 may send the alarm through the analog safety function manager 330 or perform protective operations against the defect.

That is, according to some embodiments, the defect detecting system may find defects in each component itself of the digital function block or the analog function block in step S31 or S40, or may find defects of the line (for example, the first path or the second path described in FIGS. 1 to 5) through which data is transmitted even if it is checked that there is no defect in each of the component itself of the digital function block or the analog function block.

In concluding the detailed description, those skilled in the art will appreciate that many variations and modifications may be made to the example embodiments without substantially departing from the principles of the present disclosure. Therefore, the disclosed example embodiments are used in a generic and descriptive sense only and not for purposes of limitation.

What is claimed is:

1. A defect detecting system of an automotive apparatus, the defect detecting system comprising:
  a digital function block comprising:
    a memory device configured to store data, and
    a first Built-In Self Test (BIST) configured to detect a defect of the memory device,
    wherein the digital function block is configured to operate at a first power supply voltage;
  an analog function block configured to operate at a second power supply voltage that is different than the first power supply voltage, the analog function block comprising a verification parity generator configured to:
    receive the data through a first path,
    generate a verification parity of the data, and
    transmit the verification parity to the digital function block through a second path; and
  a level shift block connected between the digital function block and the analog function block, wherein the level shift block is configured to:
    convert the first path from the first power supply voltage to a first level based on the second power supply voltage, and
    convert the second path from the second power supply voltage to a second level based on the first power supply voltage.

2. The defect detecting system of claim 1, wherein the digital function block further comprises a monitor unit configured to:
  receive the data from the memory device, and
  compare the data with the verification parity, and
  wherein the first BIST is further configured to receive a comparison result received from the monitor unit.

3. The defect detecting system of claim 2, wherein the first BIST is further configured to generate first defect information corresponding to test results of the memory device and the monitor unit, and
  wherein the digital function block further comprises a digital safety function manager configured to output an alarm corresponding to the first defect information.

4. The defect detecting system of claim 3, wherein the analog function block further comprises a second BIST configured to:
  test the verification parity generator,
  generate first analog defect information,
  output the first analog defect information to the digital safety function manager.

5. The defect detecting system of claim 3, wherein the digital function block further comprises a comparison parity generator connected to an output terminal of the memory device and configured to generate a comparison parity based on the data, and
  wherein the monitor unit is further configured to output, to the digital safety function manager, a parity comparison signal obtained by comparing the comparison parity with the verification parity.

6. The defect detecting system of claim 1, wherein the second path includes fewer lines than the first path.

7. The defect detecting system of claim 1, wherein the verification parity generator is further configured to operate based on a third power supply voltage that is lower than the first power supply voltage and lower than the second power supply voltage.

8. A defect detecting system of an automotive apparatus, the defect detecting system comprising:
  a digital function block comprising:
    a memory device configured to store data,
    a first Built-In Self Test (BIST) configured to detect a first defect in the memory device, and
    a comparison parity generator configured to generate a comparison parity for the data,
    wherein the digital function block is configured to operate at a first power supply voltage;
  a level shift block comprising:
    a first path configured to convert the data based on the first power supply voltage into a level based on a second power supply voltage that is different than the first power supply voltage and transmit the data, and
    a second path configured to convert the comparison parity based on the first power supply voltage into a level based on the second power supply voltage, and transmit the comparison parity; and
  an analog function block configured to operate at the second power supply voltage, wherein the analog function block is configured to:
    generate a verification parity using the level-converted data,
    receive a level-converted comparison parity,
    compare the comparison parity with the verification parity, and
    detect whether there is a second defect in either or both of the first path and the second path.

9. The defect detecting system of claim 8, wherein the analog function block comprises:

a verification parity generator configured to generate the verification parity based on the level-converted data; and a parity comparator configured to compare the verification parity with the comparison parity, and output a parity comparison signal.

10. The defect detecting system of claim 9, wherein the analog function block further comprises an analog safety function manager configured to output a first defect signal received by the first BIST and an alarm corresponding to the parity comparison signal.

11. The defect detecting system of claim 10, wherein the analog function block further comprises a second BIST configured to detect whether there is a third defect in the verification parity generator.

12. The defect detecting system of claim 8, wherein the second path includes fewer lines than the first path.

13. The defect detecting system of claim 9, wherein the verification parity generator and the comparison parity generator are configured to operate based on a third power supply voltage that is lower than the first power supply voltage and lower than the second power supply voltage.

14. A defect detecting system of an automotive apparatus, the defect detecting system comprising:

a digital function block configured to operate at a first power supply voltage and comprising a memory device configured to store data;

a first level shift block connected to the digital function block by a first path and configured to convert the data based on the first power supply voltage to a level based on a second power supply voltage that is different than the first power supply voltage;

an analog function block configured to operate at the second power supply voltage, the analog function block being connected to the first level shift block by the first path and comprising a verification parity generator configured to generate a verification parity from the level-converted data; and a second level shift block connected between the analog function block and the digital function block by a second path, configured to convert the verification parity based on the second power supply voltage to a level based on the first power supply voltage, wherein the digital function block is configured to detect, based on the verification parity, a first defect in the first path or an error in the data.

15. The defect detecting system of claim 14, wherein the second path includes fewer lines than lines included in the first path.

16. The defect detecting system of claim 15, wherein the verification parity is at least two bits.

17. The defect detecting system of claim 14, wherein the digital function block comprises a digital safety function manager configured to output an alarm based on the first defect or the error.

18. The defect detecting system of claim 17, wherein the digital function block is further configured to, based on a comparison parity generated from the data stored in the memory device and the verification parity not matching, generate monitor information indicating that the first path is defective, and output the monitor information to the digital safety function manager.

19. The defect detecting system of claim 14, wherein the analog function block further comprises an analog safety function manager configured to output an alarm based on the first defect in the first path, a second defect in the second path, or the error.

20. The defect detecting system of claim 19, wherein the analog function block further comprises a parity comparator configured to:

compare a comparison parity and the verification parity transmitted from the digital function block, and output a parity comparison signal to the analog safety function manager.

* * * * *